United States Patent
Funahashi et al.

(10) Patent No.: US 9,609,754 B2
(45) Date of Patent: Mar. 28, 2017

(54) PACKAGE FOR MOUNTING ELECTRONIC ELEMENT, ELECTRONIC DEVICE, AND IMAGING MODULE

(71) Applicant: KYOCERA Corporation, Kyoto-shi, Kyoto (JP)

(72) Inventors: Akihiko Funahashi, Kyoto (JP); Kanae Horiuchi, Kyoto (JP); Yousuke Moriyama, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 14/439,423

(22) PCT Filed: Jan. 22, 2014

(86) PCT No.: PCT/JP2014/051262
§ 371 (c)(1),
(2) Date: Apr. 29, 2015

(87) PCT Pub. No.: WO2014/115766
PCT Pub. Date: Jul. 31, 2014

(65) Prior Publication Data
US 2015/0305160 A1     Oct. 22, 2015

(30) Foreign Application Priority Data

Jan. 22, 2013 (JP) ................ 2013-009423
Jan. 31, 2013 (JP) ................ 2013-016832

(51) Int. Cl.
*H04N 5/225* (2006.01)
*H05K 1/18* (2006.01)
(Continued)

(52) U.S. Cl.
CPC ......... *H05K 1/183* (2013.01); *H01L 21/4857* (2013.01); *H01L 23/13* (2013.01);
(Continued)

(58) Field of Classification Search
CPC ..................................................... H05K 1/183
See application file for complete search history.

(56) References Cited

U.S. PATENT DOCUMENTS 6,232,655 B1      5/2001  Sugimura
6,518,656 B1 *    2/2003  Nakayama ........ H01L 27/14618
                                                              257/100
(Continued)

FOREIGN PATENT DOCUMENTS

JP    2004-055985 A     2/2004
JP    2005-311255 A    11/2005
(Continued)

OTHER PUBLICATIONS

International Search Report, PCT/JP2014/051262, Mar. 25, 2014, 2 pgs.
(Continued)

*Primary Examiner* — Gary C Vieaux
(74) *Attorney, Agent, or Firm* — Volpe and Koenig, P.C.

(57) ABSTRACT

There are provided a package for mounting an electronic element which can be reduced in size and an electronic device. A package for mounting an electronic element includes an insulating base including a frame section; an electrode pad disposed on an upper surface of the frame section; a first wall conductor disposed in an upper end part of an inner wall of the frame section so as to be electrically connected to the electrode pad; and a wiring conductor embedded within the frame section so as to be electrically connected to the first wall conductor. Consequently, the package for mounting an electronic element can be reduced in size, and is capable of suppressing electrical short-circuiting between the wiring conductor and an electronic element and of suppressing occurrence of a crack in the insulating base.

12 Claims, 6 Drawing Sheets

(51) Int. Cl.
    *H01L 23/13*     (2006.01)
    *H01L 23/498*     (2006.01)
    *H01L 21/48*     (2006.01)
    *H01L 27/146*     (2006.01)
    *H05K 1/02*     (2006.01)
    *H05K 1/11*     (2006.01)

(52) U.S. Cl.
    CPC .. *H01L 23/49827* (2013.01); *H01L 27/14618* (2013.01); *H04N 5/2253* (2013.01); *H04N 5/2254* (2013.01); *H04N 5/2257* (2013.01); *H05K 1/0284* (2013.01); *H05K 1/111* (2013.01); *H01L 2224/16225* (2013.01); *H01L 2224/48091* (2013.01); *H01L 2224/48227* (2013.01); *H01L 2224/49175* (2013.01); *H05K 2201/10287* (2013.01)

(56) References Cited

U.S. PATENT DOCUMENTS

2011/0156187 A1    6/2011    Tu et al.
2012/0112042 A1*    5/2012    Webster ................... G02B 7/02
                                                                                                                                                                                                            250/208.1
2013/0265486 A1*    10/2013    Webster ................... G02B 7/02
                                                                                                                                                                                         348/374

FOREIGN PATENT DOCUMENTS

| | | |
|---|---|---|
| JP | 2005-317598 A | 11/2005 |
| JP | 2006-013175 A | 1/2006 |
| JP | 2006-201427 A | 8/2006 |
| JP | 2007-053235 A | 3/2007 |
| JP | 2009-170499 A | 7/2009 |
| TW | 201123858 A1 | 7/2011 |

OTHER PUBLICATIONS

Japanese Office Action with English concise explanation, Japanese Patent Application No. 2014-558594, Sep. 20, 2016, 5 pgs.

Chinese Office Action with English concise explanation, Chinese Patent Application No. 201480002723.3, Jan. 24, 2017, 8 pgs.

* cited by examiner

FIG. 2
(a)
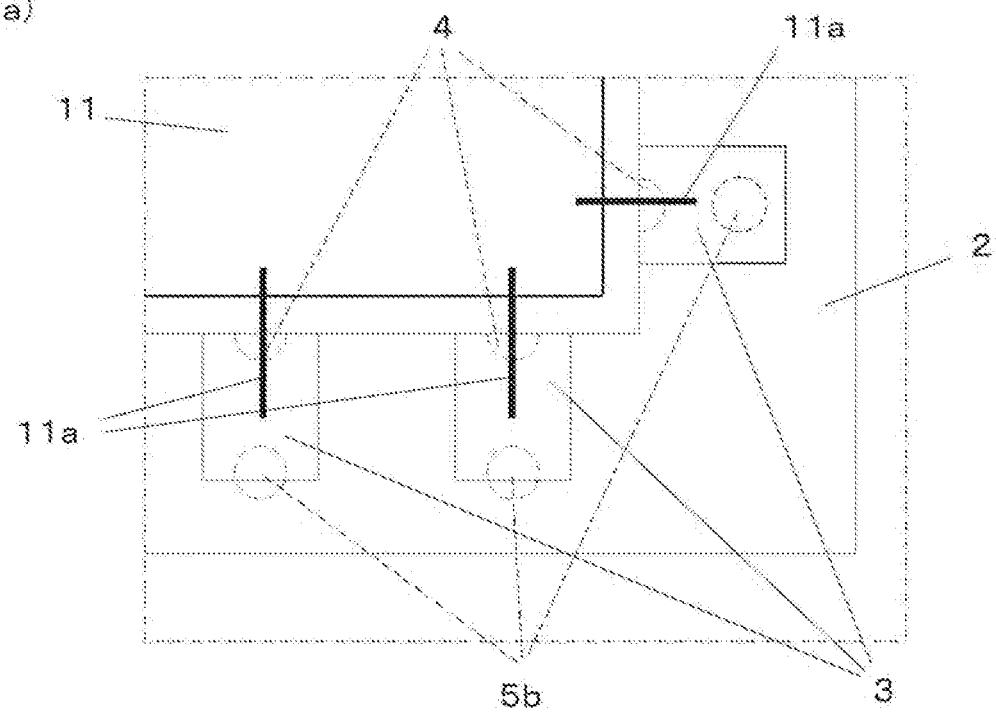
(b)
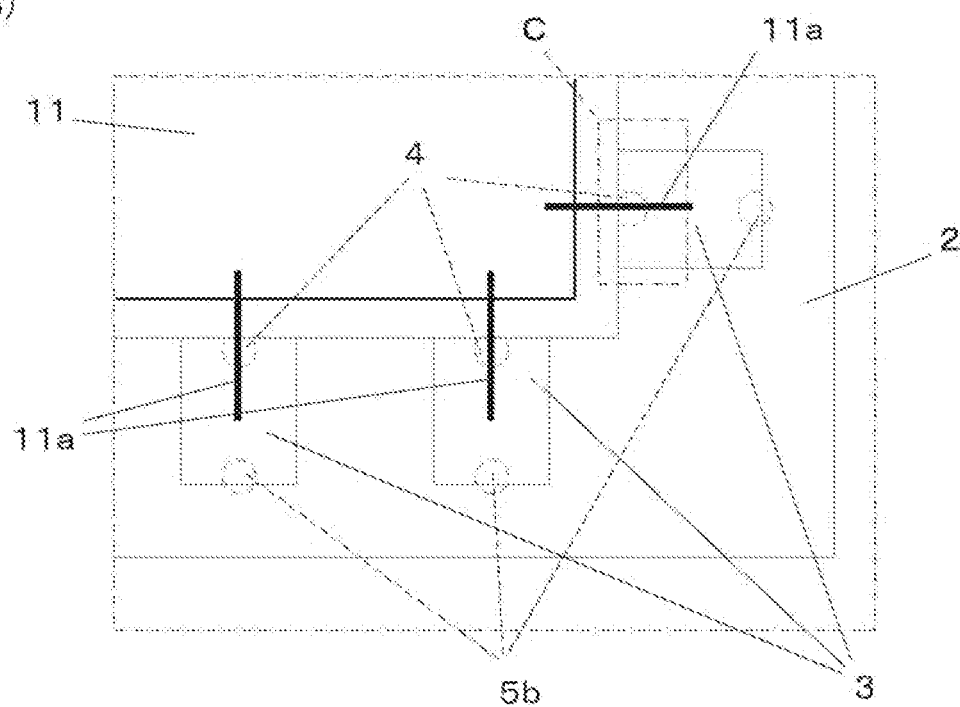

FIG. 6
(a)
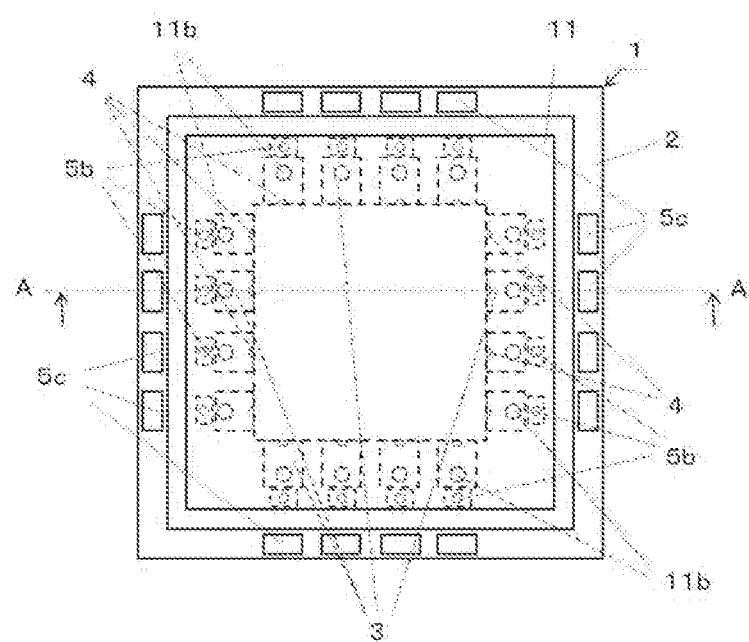
(b)
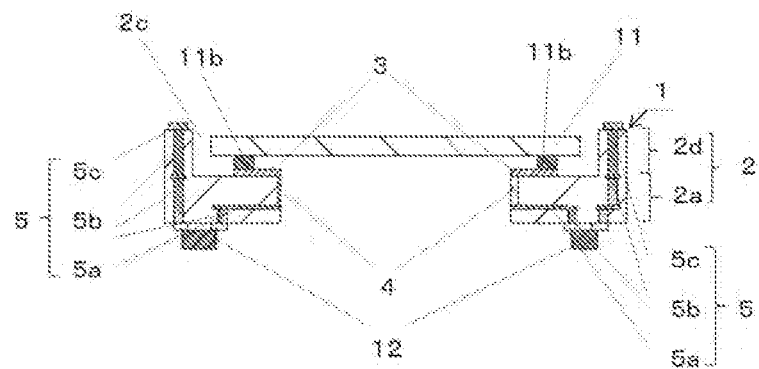

PACKAGE FOR MOUNTING ELECTRONIC ELEMENT, ELECTRONIC DEVICE, AND IMAGING MODULE

TECHNICAL FIELD

The present invention relates to a package for mounting an electronic element on which an imaging element such as a CCD (Charge Coupled Device) type element or a CMOS (Complementary Metal Oxide Semiconductor) type element, or a light-emitting element such as a LED (Light Emitting Diode) is mounted, as well as to an electronic device and an imaging module.

BACKGROUND ART

There is a heretofore know electronic device which is constructed by mounting an imaging element such as a CCD type element or a CMOS type element, or a light-emitting element such as a LED on an insulating base. As such an electronic device, there is known an apparatus comprising an insulating base having a frame section, and an electronic element mounted inside the frame section (refer to Patent Literature 1, for example). On an upper surface of the insulating base is placed an electrode pad.

CITATION LIST

Patent Literature

Patent Literature 1: Japanese Unexamined Patent Publication JP-A 2006-201427

SUMMARY OF INVENTION

Technical Problem

In keeping with the recent trend toward downsizing of electronic devices, a frame section of an insulating base has been made smaller and smaller in width, with the result that there were cases where a package for mounting an electronic element became deformed at the time of, for example, mounting of an electronic element, or generation of heat or the like during operation of an electronic element, with consequent occurrence of cracking between a through conductor and a wall surface of the frame section. In particular, at an upper end of the fraise section, a crack easily occurs between a through conductor and an inner wall surface or outer wall surface of the frame section when the package is deformed.

As electronic devices have come to be increasingly smaller, there arises a need to give consideration to electrical short-circuiting that occurs between an electronic element and a nearby wiring conductor.

Moreover, the advancement of smaller-than-ever electronic devices has led to a reduction in the size of an opening of the frame section. In consequence, there is a possibility that, when an electronic element is joined to a bottom surface of a recess of the frame section via a connecting material, the connecting material protrudes outside of an electronic-element mounting region under a pressing force resulting from the placement of the electronic element on the bottom surface of the recess, and this protuberance is brought into contact with the inner wall of the frame section. This gives rise to the possibility of occurrence of short-circuiting between wiring conductors that have to be arranged in proximity to each other in conformity with electronic device miniaturization, or occurrence of connecting material-induced short-circuiting between the electronic element and the wiring conductor on the bottom surface of the recess.

Solution to Problem

In accordance with one aspect of the invention, a package for mounting an electronic element includes an insulating base having a frame section; an electrode pad disposed on an upper surface of the frame section; a first wall conductor disposed in an upper end part of an inner wall of the frame section so as to be electrically connected to the electrode pad; and a wiring conductor embedded within the frame section so as to be electrically connected to the first wall conductor.

In accordance with another aspect of the invention, an electronic device includes the package for mounting an electronic element having the structure mentioned above; and an electronic element mounted on the package for mounting an electronic element.

In accordance with one aspect of the invention, an imaging module includes the electronic device mentioned above; a lid disposed on the upper surface of the frame section via an adhesive material; and a casing having a lens disposed on an upper surface of the lid.

Advantageous Effects of Invention

In the package for mounting an electronic element in accordance with one aspect of the invention, even if the width of the frame section of the insulating base is reduced, a crack can be restrained from occurring between the first wall conductor and an inner wall surface or outer wall surface of the frame section at the time of, for example, mounting of the electronic element or generation of heat or the like during operation of the electronic element. Moreover, since the first wall conductor is disposed on an upper end side of the inner wall surface of the frame section, it is possible to effectively restrain occurrence of a crack at an upper end of the frame section that has heretofore been susceptible to cracking. Furthermore, it is possible to decrease the possibility of occurrence of electrical short-circuiting between the electronic element and the wiring conductor located in the vicinity thereof. In addition, since the wiring conductor is embedded within the frame section, even if the connecting material for connecting a lower surface of the electronic element with the bottom surface of the recess makes contact with the inner wall of the frame section, it is possible to suppress that electrical short-circuiting occurs between the electronic element and the wiring conductor on the bottom surface due to the presence of the connecting material.

According to another aspect of the invention, since the electronic device has the package for mounting an electric element having the structure mentioned above, the electronic device can be made compact. Moreover, occurrence of a crack between the first wall conductor and the inner wall surface or outer wall surface of the frame section can be restrained, and occurrence of electrical short-circuiting between the wiring conductors can be restrained.

Since the imaging module in accordance with one aspect of the invention has the electronic device mentioned above, the imaging module can be made compact. Moreover, occurrence of a crack between the first wall conductor and the inner wall surface or outer wall surface of the frame section

BRIEF DESCRIPTION OF DRAWINGS

FIG. 2(a) is an enlarged top plan view of a part B of the electronic device shown in FIG. 1(a), and FIG. 2(b) is an enlarged top plan view showing a modified example of the electronic device shown in FIG. 2(a);

FIG. 6(a) is a top plan view showing the electronic device in accordance with an embodiment of the invention, and FIG. 6(b) shows a longitudinal section of the electronic device taken along the line A-A shown in FIG. 6(a);

DESCRIPTION OF EMBODIMENTS

Figure 1:
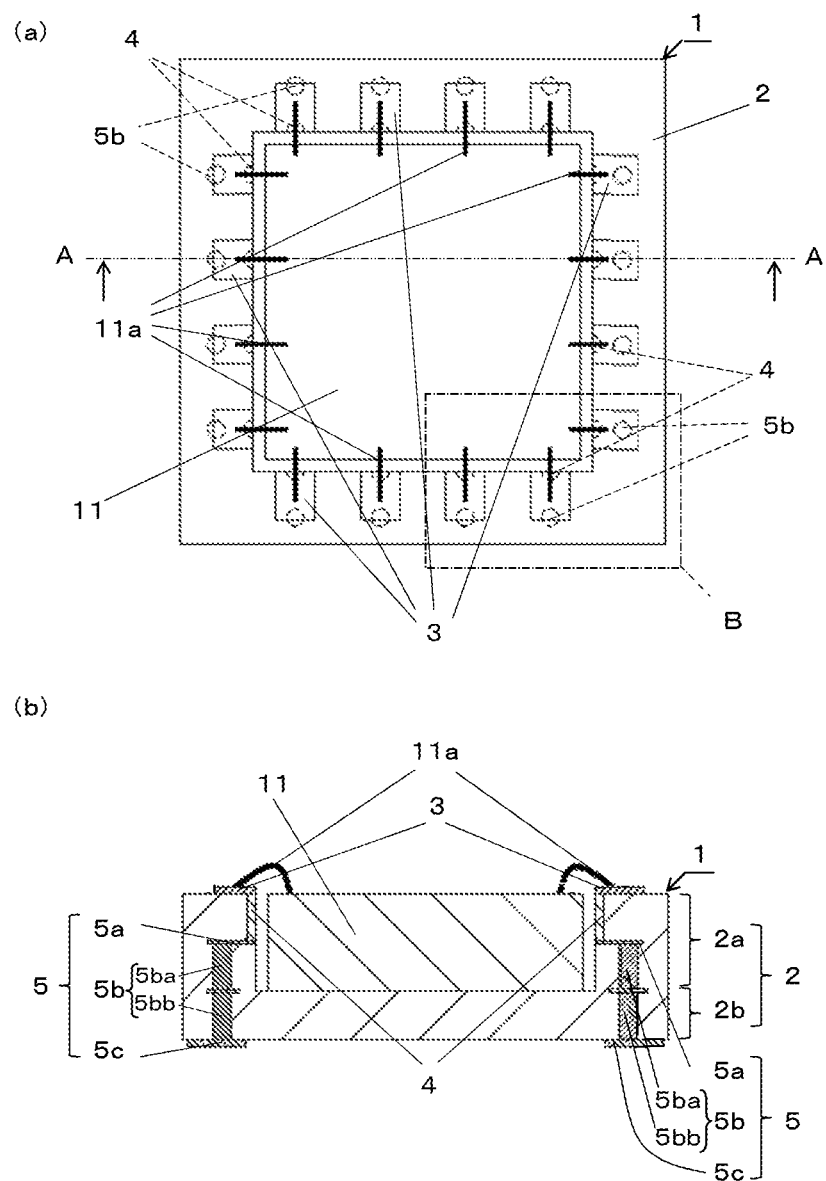
FIG. 1(a) is a top plan view showing as electronic device in accordance with an embodiment of the invention.
FIG. 1(b) shows a longitudinal section of the electronic device taken along the line A-A shown in FIG. 1(a)

Hereinafter, exemplificative embodiments of the invention will be described with reference to drawings.

An electronic device in accordance with an embodiment of the invention will be described with reference to FIGS. 1 to 7. The electronic device of the present embodiment comprises; a package for mounting an electronic element 1; and an electronic element 11 mounted on the package for mounting an electronic element 1.

The package for mounting an electronic element 1 comprises: an insulating base 2 including a frame section 2a; an electrode pad 3 disposed on an upper surface of the frame section 2a; a first wall conductor 4 disposed in an upper end part of a wall of the frame section 2a; and a wiring conductor 5 embedded within the frame section 2a.

The insulating base 2 comprises, for example, the frame section 2a and a base section 2b. The insulating base 2 has a recess which is composed of an inner wall of the frame section 2a and an upper surface of the base section 2b. For example, the insulating base 2 is constructed by vertically laminating a plurality of substantially quadrangular insulating layers, which are made of electrically insulating ceramics such as an aluminum oxide sintered compact, a mullite sintered compact, a silicon carbide sintered compact, an aluminum nitride sintered compact, a silicon nitride sintered compact, or a glass ceramics sintered compact, or resin (plastics) such as an epoxy resin, a polyimide resin, an acrylic resin, a phenol resin, a polyester resin, or a fluorine resin typified by a tetrafluoroethylene resin.

For example, the frame section 2a has a thickness of 300 to 1000 μm. Moreover, the base section 2b has a thickness of 200 to 500 μm.

a plurality of electrode pads 3 are disposed on the upper surface of the frame section 2a of the insulating bass 2 so as to be electrically connected to their respective electrodes of the electronic element 11 by means of bonding wires 11a or otherwise. In a case where the insulating base 2 is made of electrically insulating ceramics, the electrode pad 3 is formed of a metallization layer of tungsten (W), molybdenum (Mo), manganese (Mn), silver (Ag), copper (Cu), or the like.

On the other hand, in a case where the insulating base 2 is made of resin, the electrode pad 3 is formed of a metal material such as copper (Cu), gold (Au), aluminum (Al), nickel (Ni), chromium (Cr), molybdenum (Mo), titanium (Ti), or alloys of those metals.

The first wall conductor 4 is disposed in an upper end part of an inner wall of the frame section 2a so as to be electrically connected to the electrode pad 3. In an example as shown in FIG. 1, the first wall conductor 4 is a via-hole conductor which is partly put in appearance at the inner wall of the frame section 2a.

In other words, in the example shown in FIG. 1, the inner wall of the frame section 2a is provided with a groove extending in a thickness direction thereof, and, an electrode material is filled in the groove to form the first wall conductor 4 (via-hole conductor). Alternatively, for example, the first wall conductor 4 may be of an electrode film formed on an inner wall of the groove.

In the example shown in FIG. 1, a lower end of the first wall conductor 4 is spaced away from a bottom surface of the recess of the insulating base 2. In the example shown in FIG. 1, the lower end of the first wall conductor 4 is located centrally of the inner wall of the frame section 2a in a thickness direction thereof (a direction of depth of the recess); that is, it is not extended to the bottom surface of the recess.

Thus, with the provision of the first wall conductor 4 in the upper end part of the inner wall of the frame section 2a of the insulating base 2, even if the width of the frame section 2a of the insulating base 2 is reduced, a crack can be restrained from occurring between the first wall conductor 4 and an inner wall surface or outer wall surface of the frame section 2a at the time of, for example, mounting of the electronic element 11 or generation of heat or the like during operation of the electronic element 11. Particularly, since the first wall conductor 4 is disposed in the upper end part of the inner wall of the frame section 2a, it is possible to effectively restrain occurrence of a crack at the upper end part of the frame section 2a that has heretofore been susceptible to cracking. In a case where the insulating base 2 is made of ceramics, the first wall conductor 4 is formed of a metallization layer as is the case with the electrode pad 3.

The wiring conductor 5 is embedded within the frame section 2a while being electrically connected to the first wall conductor 4. Moreover, the wiring conductor 5 is, in the insulating base 2, embedded within the frame section 2a and the base section 2b so as to be led out to a lower surface of the base section 2b.

In the example shown in FIG. 1, the wiring conductor 5 is electrically connected to the lower end of the first wall conductor 4. However, this does not suggest any limitation, and the wiring conductor 5 may therefore be connected to other part of the first wall conductor 4 than the lower end thereof,. For example, the wiring conductor 5 may be connected to a lengthwise midportion of the first wall conductor 4. It is nonetheless preferable that the wiring conductor 5 is electrically connected to the lower end of the first wall conductor 4, because, in this case, there is no need to extend the first wall conductor 4 downwardly beyond a part of connection with the wiring conductor 5, wherefore it is possible to suppress occurrence of a crack in a region sandwiched between the first wall conductor 4 and the wiring conductor 5 within the frame section 2a.

Moreover, in the example shown in FIG. 1, the wiring conductor 5 is embedded within the lower end part of the frame section 2a.

In the example shown in FIG. 1, the wiring conductor 5 includes: an internal wiring 5a electrically connected to the first wall conductor 4; a through conductor 5b formed so as to pass through the frame section 2a and the base section 2b in the thickness direction thereof while being electrically connected to the internal wiring 5a; and an external terminal 5c disposed on the lower surface of the base section 2b while being electrically connected to the through conductor 5b. Thus, the electrode pad 3 can be electrically connected to an external circuit board (not shown in the drawings) via the first wall conductor 4 and the wiring conductor 5.

In the example shown in FIG. 1, the through conductor 5b includes a first through conductor 5ba which passes through the frame section 2a in the thickness direction thereof, and a second through conductor 5bb which passes through the base section 2b in the thickness direction thereof. By embedding the first through conductor 5ba of the wiring conductor 5 within the frame section 2a, even if the connecting material for connecting a lower surface of the electronic element 11 with the bottom surface of the recess mates contact with the inner wall surface of the frame section 2a, it is possible to avoid that electrical short-circuiting occur between the wiring conductors 5 on the bottom surface due to the presence of the connecting material.

In the example shown in FIG. 1, of the constituents of the wiring conductor 5, the internal wiring 5a and the through conductor 5b are spaced away from the bottom surface of the recess of the insulating base 2. In the example shown in FIG. 1, the internal wiring 5a extends inward in the frame section 2a, and, the first through conductor 5ba of the through conductor 5b is located within the frame section 2a so as not to be exposed at the bottom surface of the recess. Accordingly, even if the connecting material for connecting the lower surface of the electronic element 11 with the bottom surface of the recess makes contact with the inner wall of the frame section 2a, it is possible to suppress occurrence of electrical short-circuiting between the wiring conductors 5, or between the electronic element 11 and the wiring conductor 5, on the bottom surface due to the presence of the connecting material.

For example, the ratio of the length of the first wall conductor 4 to the thickness of the frame section falls in the range of 30% to 80%. Moreover, for example, the ratio of the length of the through conductor 5b to a thickness dimension of the frame section fails in the range of 20% to 70%. In the example shown in FIG. 1, the thickness of the frame section 2a is 500 µm; the length of the first wall conductor 4 in the thickness direction of the frame section 2a is 250 µm; and the length of the through conductor 5b in the thickness direction of the frame section 2a is 250 µm.

In a case where the insulating base 2 is made of ceramics, the wiring conductor 5 is formed of a metallization layer as is the case with the electrode pad 3. Moreover, although, in the above-mentioned construction, the wiring conductor 5 is disposed so as to be led out to a lower surface of the insulating base 2, the wiring conductor 5 may be disposed so as to be led out to a side surface or upper surface of the insulating base 2, for example.

Moreover, in a case where the insulating base 2 is made of resin, the first wall conductor 4 and the wiring conductor 5 are formed of a metal material such as copper, gold, aluminum, nickel, chromium, molybdenum, titanium, or alloys of those metals.

Figure 3:
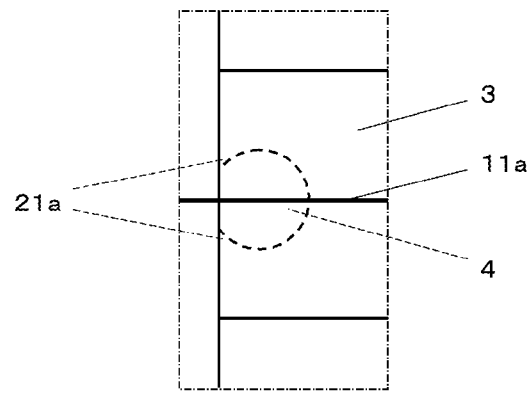
FIG. 3 is an enlarged top plan view of a part C of the electronic device shown in FIG. 2(b)

While, in the example shown in FIGS. 1 and 2(a), the first wall conductor 4 is disposed so as to present a semicircular shape as seen in a top plan view, it is preferable that, as exemplified in FIGS. 2(b) and 3, the first wall conductor 4 is disposed so as to present a shape defined by a partly cut-away circle as seen in a top plan view in order to provide a holding portion 21a where the frame section 2a holds the first wall conductor 4. This makes it possible to prevent the first wall conductor 4 from failing down inside the frame section 2a. In this case, the first wall conductor 4 is disposed within the frame section 2a so as to be partly put in appearance at the inner wall of the frame section 2a, and, when the construction is viewed from above, the width of the first wall conductor 4 situated within the frame section 2a is larger than the width of the first wall conductor 4 situated on the inner wall of the frame section 2a. Moreover, in this case, when the construction is viewed from above, the width of the first wall conductor 4 which is partly put in appearance at the inner wall of the frame section 2a is smaller than the diameter of the sectional profile of the first wall conductor 4. Note that the above-mentioned holding portion 21a where the frame section 2a holds the first wall conductor 4 corresponds to that part of the frame section 2a which protrudes toward the first wall conductor 4.

Figure 4:
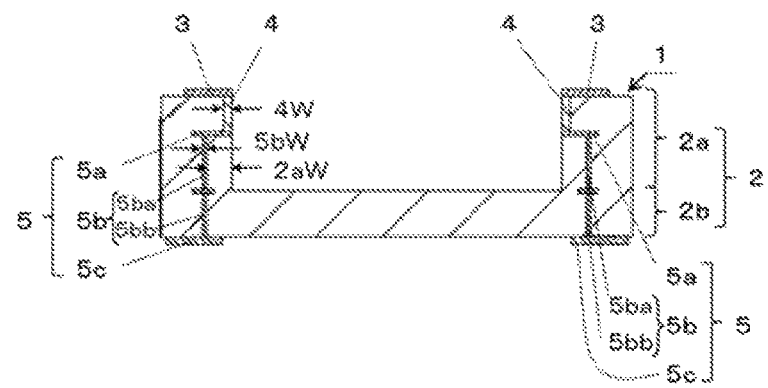
FIG. 4 is a longitudinal sectional view showing a modified example of a package for mounting an electronic element in accordance with an embodiment of the invention.

In an example as shown in FIG. 4, when seen in longitudinal sectional view, a widthwise dimension 5bW of the through conductor 5b constituting the wiring conductor 5 is smaller than a widthwise dimension 4W of the first wall conductor 4. By adopting such a structure, the through conductor 5b can be located inwardly or outwardly with respect to the center of the frame section 2a without reduction of a thickness 2aW of the insulating base 2 located inside or outside the through conductor 5b. In the case where the through conductor 5b is located inwardly or outwardly with respect to the center of the frame section 2a, It is possible to secure a region for placement of another wiring conductor within the frame section 2a, and thereby increase the number of wiring conductors to be provided. Note that, in the construction shown in FIG. 4, the through conductor 5b is located inwardly with respect to the center of the frame section 2a.

Figure 5:
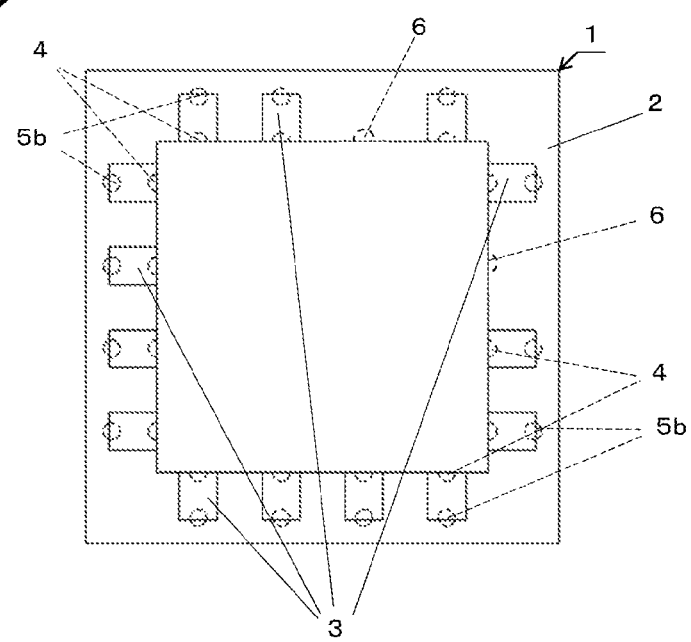
FIG. 5 is a top plan view showing a modified example of the package for mounting an electronic element in accordance with the embodiment of the invention.
Figure 7:
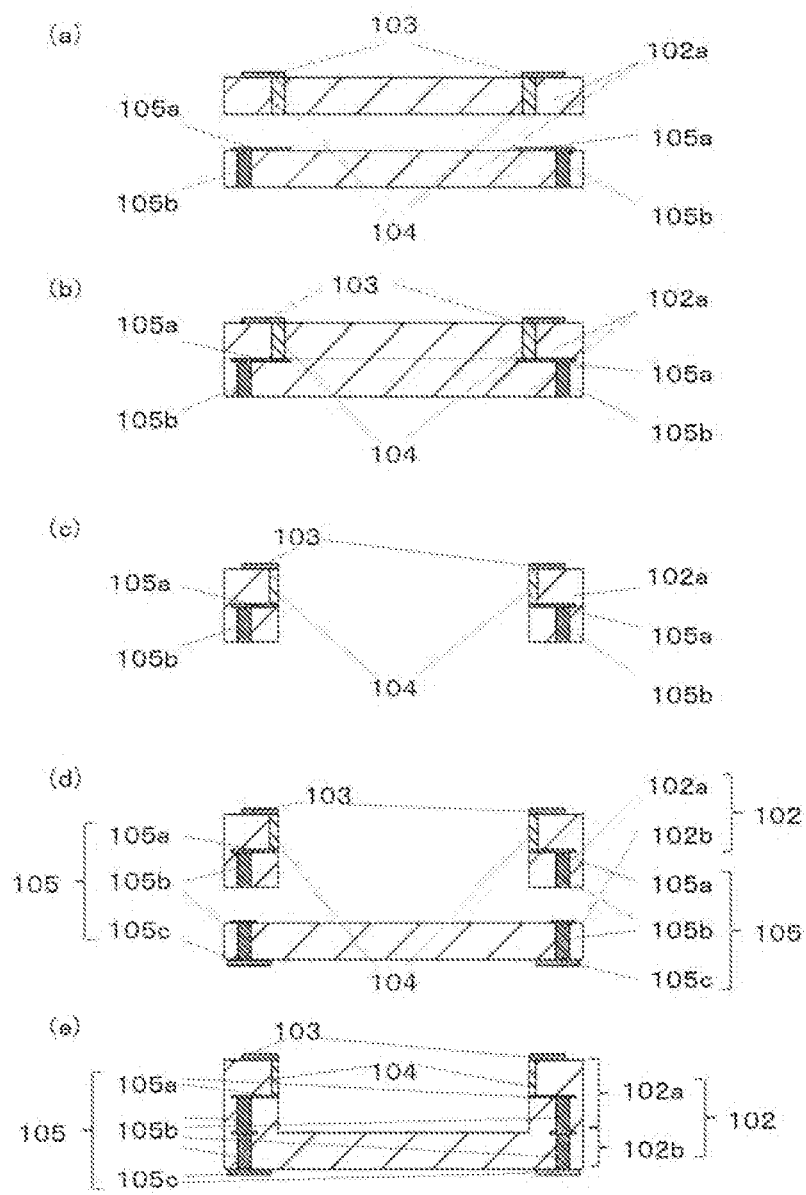
FIGS. 7(a) to 7(e) are longitudinal sectional views showing a method for manufacturing the package for mounting an electronic element in accordance with an embodiment of the invention.

Moreover, in an example as shown in FIG. 5, the above-mentioned construction further includes a second wall conductor 6 (dummy wall conductor) which is disposed in the inner wall of the frame section 2a and is not electrically connected to the electrode pad 3. By adopting such a structure, even if electrode pad 3-free areas exist around the frame section 2a and there is lack of uniformity in the arrangement of the electrode pads 3, the first wall conductor 4 and the second wall conductor 6 can be arranged, regularly on the wall surface of the frame section 2a. Therefore, even if a stress is generated due to the difference in thermal contraction between the insulating base 2 made of an insulator such as ceramics and the metal-made first and second wall conductors 4 and 6, the insulating base 2 can be protected from deformation. In a case where the insulating base 2 is made of ceramics, the second wall conductor 6 is formed of a metallization layer as is the case with the electrode pad 3.

In the example shown in FIGS. 1 and 2, when seen in a top plan view, the electrode pad 3 has a first region where the electrode pad 3 overlaps with the first wall conductor 4 and a second region where there is no overlap of the electrode pad 3 with the first wall conductor 4, and, the electronic element 11 is electrically connected to the electrode pad 3 within the range of the second region by means of a connecting member (bonding wire 11a or otherwise). By adopting such a structure, even if the first wall conductor 4 protrudes beyond the upper surface of the frame section 2a of the insulating base 2 due to the difference in thermal contraction between the insulating base 2 made of an Insulator such as ceramics and the first wall conductor 4 made of metal, since the electrode pad 3 is made flat at the second region, it is possible to permit successful electrical connection of the electronic element 11 with the electrode pad 3 by means of the bonding wire 11a or otherwise.

In the example shown in FIGS. 1 and 2, the wiring conductor 5 has the through conductor 5b, and, the electrode pad 3 is electrically connected to the electronic element 11 by means of a connecting member (bonding wire 11a or otherwise). When seen in a top plan view, at a position of electrical connection of the electrode pad 3 with the electronic element 11, there is no overlap of the electrode pad 3 with the first wall conductor 4 or the through conductor 5b of the wiring conductor 5. By adopting such a structure, even if the first wall conductor 4 protrudes beyond the upper surface of the frame section 2a of the insulating base 2 due to the difference in thermal contraction between the insulating base 2 made of an insulator such as ceramics and the first wall conductor 4, as well as the through conductor 5b of the wiring conductor 5 made of metal, since the electrode pad 3 is made flat at a location where there is no overlap of the electrode pad 3 with both of the first wall conductor 4 and the through conductor 5b of the wiring conductor 5, it is possible to permit successful electrical connection of the electronic element 11 with the electrode pad 3 by means of the bonding wire 11a or otherwise.

In an example as shown in FIG. 6, the insulating base 2 does not include the base section 2b. In this example, the insulating base 2 comprises the frame section 2a, and a frame section 2d having a through hole 2c which is larger than the through hole of the frame section 2a. In this insulating base 2, a recess is composed of the upper surface of the frame section 2a and the inner wall surface of the frame section 2d. The electronic element 11 is flip-chip mounted in the recess. For example, each electrode of the electronic element 11 is electrically connected to the electrode pad 3 by a connection terminal 11b such as a gold bump or solder.

Also in this case, the above-mentioned structure can he applied. In the foregoing example, given that the electronic element 11 is, for example, a CCD-type imaging element or a CMOS-type imaging element, then light coming from above an electronic device is received by the electronic element 11, and, on the other hand, in the example shown in FIG. 6, light coming from below an electronic device is received by the electronic element 11.

For example, in a case where another electronic element 12, such as a chip capacitor, a resistor element, a semiconductor element, or a light-emitting element such, as an LED, is mounted in the frame section 2a, by embedding the wiring conductor 5 within the frame section 2a, it is possible to prevent the another electronic element 12 installed in the insulating base 2 from making contact with the wiring conductor 5 located in the vicinity thereof, and thereby decrease the possibility of electrical short-circuiting between the another electronic element 12 and the wiring conductor 5 located in the vicinity thereof.

Moreover, it is advisable to provide, as a so-called underfill material, a joining material made of resin such for example as an epoxy resin in the location where the electronic element 11 or another electronic element 12 is flip-chip mounted in the interest of more reliable electrical connection. Note that a connecting member made of an electrically conductive resin (such as an anisotropic conductive resin) may be used instead of the above-mentioned connection terminal 11b such as a gold bump or solder to permit electrical connection of individual electrodes of the electronic element 11 or another electronic element 12 with the two or more electrode pads 3.

Next, a method for manufacturing the package for mounting an electronic element 1 of the present embodiment will be described.

The insulating base 2 is made of electrically insulating ceramics such for example as an aluminum oxide ($Al_2O_3$) sintered compact, and comprises the frame section 2a and the base section 2b, for example. In a case where the insulating base 2 is made of an aluminum oxide, sintered compact composed predominantly of aluminum oxide ($Al_2O_3$), in addition to powder of, for example, silica ($SiO_2$), magnesia (MgO), or calcia (CaO) serving as a sintering aid, suitable binder, solvent, and plasticizer are added to $Al_2O_3$ powder, and the resultant powder mixture is kneaded to form a slurry. After that, the slurry is molded into a segmentable ceramic green sheet by a heretofore known molding technique such as the doctor blade method or the calender roll method.

With use of the ceramic green sheet, the package for mounting an electronic element 1 is produced by performing the following process steps (1) to (6).

(1) A step of printing a metal paste 103, a metal paste 104, and a metal paste 105 (including 105a, 105b, and 105c) that constitute: the electrode pad 3 which is formed on an area corresponding to the upper surface of the frame section 2a; the first wall conductor 4 or the second wall conductor 6 in the form of a via hole conductor that is formed on an area corresponding to the upper end part of the wall surface of the frame section 2a; and the wiring conductor 5 including the through conductor 5b in the form of a via hole conductor or the like that is formed so as to extend from the lower end of the first wall conductor 4 to the inside of the insulating base 2, and from there to the lower surface of the insulating base 2, respectively (FIG. 7(a)).

(2) A step of laminating ceramic green sheets 102a that become individual insulating layers on top of each other (FIG. 11b)).

(3) A step of conducting punching operation using a punching die or lasering operation on an area corresponding to the inner wall surface of the frame section 2a so that the metal paste 104 can be exposed thereat (FIG. 7(c)).

(4) A step of producing a ceramic green sheet laminate 102 by laminating ceramic green sheets 102a and 102b that become individual insulating layers on top of each other (FIGS. 7(d) and 7(e)).

(5) A step of obtaining a segmentable substrate bearing an arrangement of a plurality of insulating bases 2 comprising the wall surface of each frame section 2a, the first wall conductor 4, and the wiring conductor 5 by firing the ceramic green sheet laminate 102 at a temperature of about 1500 to 1800° C.

(6) A step of dividing the segmentable substrate obtained through the firing process into pieces by, for example, breaking the substrate along dividing grooves each of which has previously been formed on the segmentable substrate along a line defining the outer edge of each package for mounting an electronic element 1, or cutting the substrate along lines defining the outer edges of the packages for mounting an electronic element 1 by means of slicing or otherwise. While the dividing grooves can be formed after firing process by making small incisions whose dimensions are smaller than the thickness of the segmentable substrate using a slicing machine, they can also be formed before firing process by making small incisions whose dimensions are smaller than the thickness of a segmentable substrate-forming green molded body using a slicing machine or using a cutter blade which is pressed against the green molded body.

In the process step (1), the electrode pad 3 is formed in each of predetermined positions of a plurality of insulating bases 2 by printing the metal paste 103 in a predetermined pattern to the ceramic green sheet for the insulating base 2 by means of screen printing or otherwise, and simultaneously firing the paste together with the ceramic green sheet for the insulating base 2. Such a metal paste 103 is prepared by kneading metal powder such as tungsten, molybdenum, manganese, silver or copper in admixture with suitable solvent and binder, and subsequently adjusting the viscosity to an appropriate level. In order to enhance the strength of adhesion with the insulating base 2, the metal paste 103 may contain glass or ceramics.

Moreover, the first wall conductor 4 is, in a case where the conductor is formed so as to pass through the ceramic green sheet in the thickness direction thereof in the form of a via hole conductor, formed by: filling a through hole created in the ceramic green sheet with the metal paste 104 prepared for the first wall conductor 4 by printing using the screen printing technique, etc.; forming a through hole for the frame section 2a so that the via hole conductor can be exposed during the above-mentioned punching or lasering operation; and firing the paste together with the ceramic green sheet at one time. Thus, by forming a through hole for the frame section 2a in the ceramic green sheet so that the via hole conductor can be exposed using a punching die or the like, even If the width of the frame section 2a of the insulating base 2 is reduced, it is possible to render an area corresponding to the upper end part of the inner wall surface of the frame section 2a resistant to cracking, because no thin part will be formed between the via hole conductor of the ceramic green sheet for the frame section 2a and the through hole for the frame section 2a in the area corresponding to the upper end part of the inner wall surface of the frame section 2a. The above-mentioned metal paste 104 is prepared by a method similar to the way to prepare the metal paste 103 used for the electrode pad 3, and, in the interest of enhancement in the strength of adhesion with the insulating base 2, the metal paste 104 may contain glass or ceramics.

Moreover, the first wall conductor 4 may be given the form of an electrode film which is obtained by printing the metal paste 104 to the ceramic green sheet. In the case of forming the electrode film, it is advisable that a groove is created at an inner wall surface of the ceramic green sheet formed with a through hole in advance, and the metal paste 104 is applied in a film-like pattern to an inner wall surface of the groove.

Moreover, the wiring conductor 5 is formed of a metallization layer as is the case with the electrode pad 3, and more specifically, it is formed in a predetermined position of the insulating base 2 by printing the metal paste 105 prepared for the wiring conductor 5 in a predetermined pattern to the ceramic green sheet for the insulating base 2 by means of screen printing or otherwise, and simultaneously firing the paste together with the ceramic green sheet. Of the constituents of the wiring conductor 5, the through conductor 5b passing through the ceramic green sheet in the thickness direction thereof may advisably be formed by filling a through hole formed in the ceramic green sheet with the metal paste 105 by means of printing. Such a metal paste 105 is prepared by a method similar to the way to prepare the metal paste 103 used for the electrode pad 3.

Moreover, in the process step (3), for the formation of the insulating base 2 including the frame section 2a, it is advisable to create a through hole for the frame section 2a in some of ceramic green sheets for the insulating base 2 by means of punching using a die or punch, lasering, or otherwise during the above-mentioned punching or lasering operation.

In a case where the insulating base 2 is made of, for example, resin, the formation process can be achieved by means of transfer molding, injection molding, or otherwise using a mold capable of providing a molding of predetermined shape. Moreover, a material obtained by impregnating a base material made of glass fiber with resin, such for example as glass epoxy resin, may be used. Such a material can be formed by impregnating a base material made of glass fiber with a precursor of epoxy resin, and thermally curing the epoxy resin precursor at a predetermined temperature.

Moreover, in a case where the insulating base 2 is made of resin, the electrode pad 3 is formed of a metal material such as copper (Cu), gold (Au), aluminum (Al), nickel (Ni), chromium (Cr), molybdenum (Mo), titanium (Ti), or alloys of those metals. For example, the formation process is achieved by: transfer-printing copper foil which has been worked into a wiring-conductor form onto a resin sheet made of glass epoxy resin; laminating the resin sheets bearing the transfer-printed copper foil; and bonding them with an adhesive. Alternatively, the formation process may be achieved by integrating metal foil or a metal column with the insulating base made of resin, or by coating metal foil or a metal column on the insulating base 2 by means of sputtering, vapor deposition, plating, or otherwise.

Moreover, in a case where the insulating base 2 is made of resin, the first wall conductor 4 and the wiring conductor 5 are formed of a metal material such as copper, gold, aluminum, nickel, chromium, molybdenum, titanium, or alloys of those metals. For example, the formation process is achieved by: transfer-printing copper foil which has been worked into a wiring-conductor form onto a resin sheet made of glass epoxy resin; laminating the resin sheets bearing the transfer-printed copper foil; and bonding them with an adhesive. The through conductor passing through the resin sheet In the thickness direction thereof may advisably be formed by placing a metal paste on the inner surface of a through hole formed in the resin sheet by means of printing or plating, or formed by filling the through hole with the metal paste. Moreover, the formation process may also be achieved by integrating metal foil or a metal column with the insulating base made of resin, or by coating metal foil or column on the insulating base 2 by means of sputtering, vapor deposition, plating, or otherwise.

Moreover, in order to protect the electrode pad 3, the first and second wall conductors 4 and 6 formed of via hole-conductors exposed at the surface of the insulating base 2, and the wiring conductor 5 against oxidation, exposed surfaces of the electrode pad 3, the first wall conductor 4, the wiring conductor 5, and the second wall conductor 6 may advisably be coated with a Ni plating layer having a thickness of 0.5 to 10 µm, or coated with this Ni plating layer and also a gold (Au) plating layer having a thickness of 0.5 to 3 µm sequentially.

By installing an electronic device in which the electronic element 11 is mounted on the base section 2b so as to be situated inside the frame section 2a in the thusly constructed package for mounting an electronic element 1, on an external circuit board, the electronic element 11 is electrically connected to the external circuit board via the electrode pad 3, the first wall conductor 4, and the wiring conductor 5.

For example, the electronic element 11 is a CCD-type imaging element, a CMOS-type imaging element, an IC element, a semiconductor element, or a light-emitting element such as an LED. Moreover, the package for mounting an electronic element 1 on which the electronic element 11 is installed is further provided with a lid 14 for covering the recess.

In a case where the electronic element 11 is, for example, a light-emitting element such as an LED, a CCD-type imaging element, or a CMOS-type imaging element, for example, a transparent body made of glass, quartz, a filter, or the like is used as a material to form the lid 14. On the other hand, in a case where the electronic element 11 is, for example, an IC element or a semiconductor element, for example, the above-mentioned transparent body or a metal is used as a material to form the lid 14.

Each electrode of the electronic element 11 is electrically connected to the electrode pad 3 of the package for mounting an electronic element 1 by a connecting member such as the bonding wire 11a. or the connection terminal 11b made of a gold bump or solder.

As the connecting material for connecting the electronic element 11 with the bottom surface of the recess of the insulating base 2, for example, a resin connecting material such as a thermosetting resin is used. The connecting material may contain metal particles or the like. For example, a silver epoxy resin is used for the connecting material.

The package for mounting an electronic element 1 of the present embodiment comprises: the insulating base 2 including the frame section 2a; the electrode pad 3 disposed on the upper surface of the frame section 2a; the first wall conductor 4 disposed in the upper end part of the wall of the frame section 2a; and the wiring conductor 5 embedded within the frame section 2a. In this construction, even if the width of the frame section 2a of the insulating base 2 is reduced, a crack can be restrained from occurring between the first wall conductor 4 and the inner wall surface or outer wall surface of the frame section 2a at the time of, for example, mounting of the electronic element 11 or generation of heat or the like during operation of the electronic element 11. Moreover, it is possible to decrease the possibility of occurrence of electrical short-circuiting between the electronic element 11 and the wiring conductor 5 located in the vicinity thereof.

According to another aspect of the invention, since the electronic device has the package for mounting an electronic element 1 having the structure mentioned above, the electronic device can be made compact.

Figure 8:
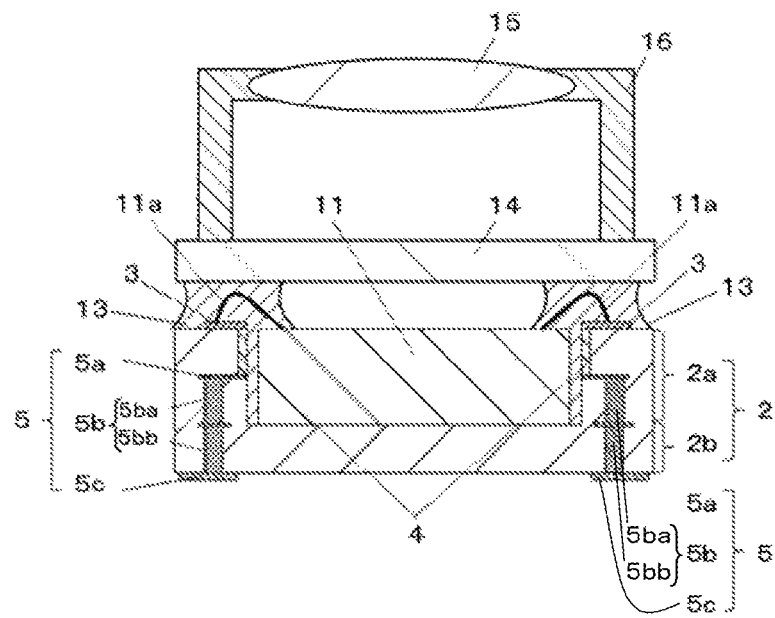
FIG. 8 shows a longitudinal section of an imaging module in accordance with an embodiment of the invention.

Next, with reference to FIG. 8, an imaging module pursuant to the invention will be described. The imaging module comprises: an electronic device on which an imaging element is mounted as the electronic element 10 mentioned above; a lid 14; and a casing 16. The electronic device is Installed with an imaging element as the electronic element 11. For example, a transparent body made of glass, quartz, a filter, or the like is used as a material to form the lid 14.

The lid 14 is disposed on the upper surface of the frame section 2a via an adhesive material 13. The adhesive material 13 is, for example, a resin adhesive material such as an insulating thermosetting resin. In an example as shown in FIG. 8, part of the adhesive material 13 is located on an outer edge of an upper surface of the electronic element 11 while covering the bonding wire 11a. Moreover, as exemplified in FIG. 8, the adhesive material 13 may be applied so that a part of the adhesive material 13 enters a region between the inner wall surface of the frame section 2a and a side surface of the electronic element 11.

The casing 16 is disposed on an upper surface of the lid 14, and has a lens 15. In the example shown in FIG. 8, the casing 16 is placed so that a lower end part thereof is situated on the outer periphery of the upper surface of the lid 14. For example, a resin adhesive material such as a thermosetting resin is used to achieve connection between the lid 14 and the casing 16.

Since the imaging module of the invention has the electronic device of the invention, the lid 14 disposed on the upper surface of the frame section 2a via the adhesive material 13, and the casing 16 with the lens 15 disposed on the upper surface of the lid 14, the imaging module can be made compact. Moreover, occurrence of a crack between the first wall conductor 4 and the inner wall surface or outer wall surface of the frame section 2a, as well as occurrence of electrical short-circuiting between the wiring conductors, can be restrained.

Next, with reference to FIG. 9, a modified example of the electronic device in accordance with the embodiment of the invention will be described. The electronic device of the present embodiment differs from the embodiment shown in FIG. 1 in respect of the shape of the electrode pad 3.

Figure 9:
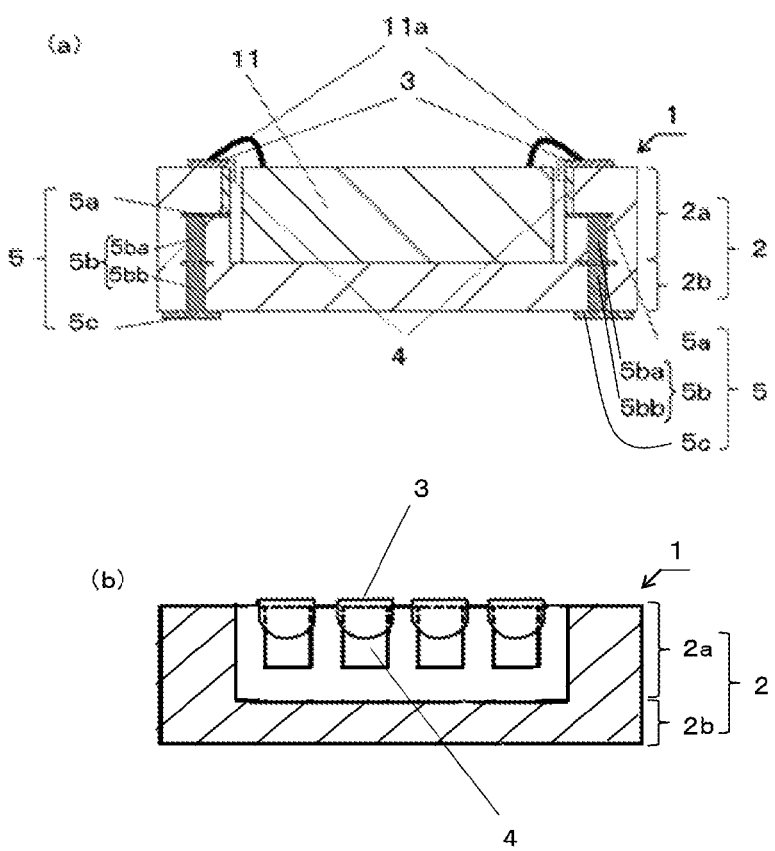
FIG. 9(a) is a longitudinal sectional view showing a modified example of the electronic device in accordance with the embodiment of the invention.
FIG. 9(b) is a longitudinal sectional view showing an inner wall of a frame section of the electronic device shown in FIG. 9(a).

In the example shown in FIG. 9, the electrode pad 3 extends from the upper surface of the frame section 2a to the inner wall surface of the frame section 2a. In this case, even if the upper end of the frame section 2a becomes deformed under heat, the first wall conductor 4 can be restrained against separation from the inner wall of the frame section 2a.

Moreover, its an example as shown in FIG. 9(b), the electrode pad 3 is made larger in width than the first wall conductor 4. In this case, the first wall conductor 4 can be restrained against separation from the inner wall of the frame section 2a more reliably.

REFERENCE SIGNS LIST

1: Package for mounting electronic element
2: Insulating base
2a: Frame section
3: Electrode pad
4: First wall conductor
5: Wiring conductor
11: Electronic element
13: Adhesive material
14: Lid
15: Lens
16: Casing

The invention claimed is:

1. A package for mounting an electronic element, comprising:
   an insulating base having a plate-shaped base section including an upper main surface on which an electronic element is to be mounted, and a frame section disposed on the upper main surface of the plate-shaped base section;

an electrode pad disposed on an upper surface of the frame section;

a first wall conductor disposed in an upper end part of an inner wall of the frame section, being electrically connected to the electrode pad; and a wiring conductor including a first through conductor which is entirely embedded within the frame section and is electrically connected to the first wall conductor, and a second through conductor which is embedded within the base section and is electrically connected to the first through conductor.

2. The package for mounting an electronic element according to claim 1, wherein a part of the first wall conductor disposed in the upper end part of the inner wall of the frame section is put in appearance at an inner wall of the frame section, and a width of the first wall conductor located within the frame section is larger than a width of the first wall conductor located on the inner wall, as seen in a top plan view.

3. The package for mounting an electronic element according to claim 1, wherein widthwise dimensions of the first and second through conductor are smaller than a widthwise dimension of the first wall conductor, as seen in a longitudinal sectional view.

4. The package for mounting an electronic element according to claim 1, further comprising:

a second wall conductor disposed in the inner wall of the frame section, not being electrically connected to the electrode pad.

5. The package for mounting an electronic element according to claim 1, wherein the wiring conductor is electrically connected to a lower end of the first wall conductor.

6. The package for mounting an electronic element according to claim 1, wherein the electrode pad extends from the upper surface of the frame section to an inner wall surface of the frame section.

7. The package for mounting an electronic element according to claim 6, wherein the electrode pad is made larger in width than the first wall conductor.

8. An electronic device, comprising:

the package for mounting an electronic element according to claim 1; and the electronic element mounted on the package for mounting an electronic element, the electronic element being electrically connected to the electrode pad.

9. The electronic device according to claim 8, wherein the electrode pad has a first region where the electrode pad overlaps with the first wall conductor and a second region where there is no overlap of the electrode pad with the first wall conductor, as seen in a top plan view, and the electronic element is electrically connected to the electrode pad within the second region via a connecting member.

10. The electronic device according to claim 8, wherein the electrode pad is electrically connected to the electronic element via a connecting member, and at a position of electrical connection of the electrode pad with the electronic element, there is no overlap of the electrode pad with the first wall conductor or the first and second through conductors of the wiring conductor, as seen in a top plan view.

11. The electronic device according to claim 8, wherein the electronic element is an imaging element.

12. An imaging module, comprising:

the electronic device according to claim 11;

a lid disposed on the upper surface of the frame section via an adhesive material; and a casing having a lens disposed on an upper surface of the lid.

* * * * *